(12) United States Patent
Shimomura et al.

(10) Patent No.: US 7,348,222 B2
(45) Date of Patent: Mar. 25, 2008

(54) METHOD FOR MANUFACTURING A THIN FILM TRANSISTOR AND METHOD FOR MANUFACTURING A SEMICONDUCTOR DEVICE

(75) Inventors: Akihisa Shimomura, Atsugi (JP); Hideto Ohnuma, Atsugi (JP); Hironobu Shoji, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/878,388

(22) Filed: Jun. 29, 2004

(65) Prior Publication Data

US 2004/0266147 A1    Dec. 30, 2004

(30) Foreign Application Priority Data

Jun. 30, 2003    (JP)    ............................. 2003-189025

(51) Int. Cl.
*H01L 21/84*    (2006.01)
*H01L 21/00*    (2006.01)
*H01L 21/331*   (2006.01)
*H01L 21/205*   (2006.01)

(52) U.S. Cl. ...................... 438/149; 438/166; 438/153; 438/487; 438/482; 438/486; 438/151; 438/162; 438/378; 257/66; 257/347; 257/E21.13; 257/E21.133; 257/E21.134; 257/E21.193; 257/E21.517

(58) Field of Classification Search ................ 438/795, 438/166, 149, 487, 482, 486, 151, 153, 162, 438/378; 257/66, 77, 347, E21.13, E21.133, 257/E21.134, E21.193, E21.517

See application file for complete search history.

(56) References Cited

U.S. PATENT DOCUMENTS 5,543,352 A * 8/1996 Ohtani et al. ................ 438/487
5,569,610 A    10/1996 Zhang et al.

(Continued)

FOREIGN PATENT DOCUMENTS

JP         07-161634        6/1995

(Continued)

OTHER PUBLICATIONS

Nakata et al., "Crystallization of an A-Si Film by a ND:YAG Pulse Laser Beam with Linear Polarization"; AM-LCD '00 Digest of Technical Papers; pp. 265-268, Jul. 12-14, 2000.

(Continued)

*Primary Examiner*—Michael Lebentritt
*Assistant Examiner*—Mohsen Ahmadi
(74) *Attorney, Agent, or Firm*—Nixon Peabody LLP; Jeffrey L. Costelli

(57) ABSTRACT

It is an object of the present invention to provide a method for removing the metal element from the semiconductor film which is different from the conventional gettering step for removing the metal element from the semiconductor film.

In the present invention, when Ni element (Ni) is used as the metal element and a silicon-based film (referred to as a silicon film) is used as the semiconductor film, nickel silicide segregates in the ridge formed in the silicon film by irradiating the pulsed laser light. Next, etching solution of hydrofluoric acid based etchant is used to remove the nickel silicide segregated in the ridge. When the surface of the semiconductor film is rough after removing the metal element by means of etching, the laser light may be irradiated to the semiconductor film under the insert atmosphere to flatten the surface thereof.

33 Claims, 10 Drawing Sheets

U.S. PATENT DOCUMENTS

| | | | |
|---|---|---|---|
| 5,612,250 | A | 3/1997 | Ohtani et al. |
| 5,621,224 | A | 4/1997 | Yamazaki et al. |
| 5,712,191 | A | 1/1998 | Nakajima et al. |
| 5,756,364 | A | 5/1998 | Tanaka et al. |
| 5,795,795 | A * | 8/1998 | Kousai et al. ............... 438/166 |
| 5,824,573 | A | 10/1998 | Zhang et al. |
| 5,858,823 | A | 1/1999 | Yamazaki et al. |
| 5,879,977 | A | 3/1999 | Zhang et al. |
| 6,110,770 | A | 8/2000 | Zhang et al. |
| 6,143,661 | A | 11/2000 | Kousai et al. |
| 6,190,949 | B1 | 2/2001 | Noguchi et al. |
| 6,232,156 | B1 | 5/2001 | Ohtani et al. |
| 6,319,761 | B1 | 11/2001 | Zhang et al. |
| 6,331,457 | B1 | 12/2001 | Yamazaki et al. |
| 6,335,541 | B1 | 1/2002 | Ohtani et al. |
| 6,451,638 | B1 | 9/2002 | Zhang et al. |
| 6,479,329 | B2 | 11/2002 | Nakajima et al. |
| 6,548,830 | B1 | 4/2003 | Noguchi et al. |
| 6,777,713 | B2 * | 8/2004 | Miyairi et al. ................. 257/66 |
| 6,828,179 | B2 * | 12/2004 | Yamazaki et al. .......... 438/166 |
| 6,890,840 | B2 | 5/2005 | Isobe et al. |
| 7,247,527 | B2 | 7/2007 | Shimomura et al. |
| 2003/0122129 | A1 * | 7/2003 | Yamazaki et al. ............ 257/64 |
| 2003/0143375 | A1 | 7/2003 | Noguchi et al. |
| 2004/0259389 | A1 * | 12/2004 | Yamazaki et al. .......... 438/795 |
| 2004/0266223 | A1 | 12/2004 | Tanaka et al. |
| 2005/0023531 | A1 | 2/2005 | Shoji et al. |
| 2005/0026401 | A1 | 2/2005 | Shimomura et al. |
| 2005/0208710 | A1 * | 9/2005 | Isobe et al. ................. 438/149 |

FOREIGN PATENT DOCUMENTS

| | | |
|---|---|---|
| JP | 10-041234 | 2/1998 |
| JP | 2001-223219 | 8/2001 |
| JP | 2002-203789 | 7/2002 |

OTHER PUBLICATIONS

Oron.M et al., "New Experimental Evidence of the Periodic Surface Structure in Laser Annealing," Appl. Phys. Lett. (Applied Physics Letters), Nov. 15, 1979, vol. 35, No. 10, pp. 782-784.

Fauchet,P et al., "Surface Ripples on Silicon and Gallium Arsenide Under Picosecond Laser Illumination," Appl. Phys. Lett. (Applied Physics Letters), May. 1, 1982, vol. 40, No. 9, pp. 824-826.

* cited by examiner point 1 point 2 point 3 point 4 point 5

METHOD FOR MANUFACTURING A THIN FILM TRANSISTOR AND METHOD FOR MANUFACTURING A SEMICONDUCTOR DEVICE

BACKGROUND OF THE INVENTION

1. Field of the Invention

The present invention relates to a method for manufacturing a thin film transistor having a crystalline semiconductor film manufactured by a method for reducing the concentration of a metal element included in the crystalline semiconductor film. Moreover, the present invention relates to a method for manufacturing a semiconductor device having the thin film transistor.

2. Related Art

Recently, a research has been advanced concerning a sophisticated semiconductor device with the use of a thin film transistor. In particular, in the semiconductor device requiring rapidity and high functionality, it is necessary to use a thin film transistor (hereinafter also referred to as TFT) having high mobility. In order to enhance the crystallinity of the semiconductor film, a crystallizing step has been performed in such a way that the metal element for promoting the crystallinity typified by nickel (Ni) is added, formed, or applied to the semiconductor film and then the heat treatment is performed thereto to form the crystalline semiconductor film.

It has been understood that when the metal element typified by Ni for promoting the crystallization is employed in such a crystallizing step, it is possible to obtain the crystalline semiconductor film having a large crystal grain and to obtain the crystalline semiconductor film in which the grain boundaries are likely to unite, thereby having fewer crystal defects. Moreover, it is possible to form the crystalline semiconductor film with the crystal orientation aligned by employing such a crystallizing step.

However, the metal element typified by Ni causes an adverse effect on the device property of TFT. In particular, when Ni is used to crystallize a silicon-based semiconductor film, Ni is precipitated in the crystal grain boundaries and the like as nickel silicide ($NiSi_2$, $Ni_3Si_2$, $Ni_2Si$, or the like). When a channel-forming region, a drain region, or a source region of the thin film transistor is formed in the region where nickel silicide exists, it becomes a current path causing the increase of the off-state current.

Therefore, there has been provided a step for removing (hereinafter referred to as gettering) them. This step is hereinafter referred to as a gettering step. The gettering step has been known as a technique for segregating the metal impurity taken in the semiconductor film in a gettering site by some kind of energy so as to decrease the impurity concentration in the active region of the element.

For example, the gettering step is performed in such a way that an impurity region with the noble gas element added is formed, and then the metal element included in the semiconductor film is removed by segregating it in the impurity region through the heat treatment (for example, refer to the patent document 1). Alternatively, the impurity element in the semiconductor can be gettered in a material having the tensile stress not less than the predetermined value by forming it adjacent to the semiconductor (for example, refer to the patent document 2).

[Patent Document 1]
Japanese Patent Unexamined Publication No. 2002-203789 bulletin

[Patent Document 2]
Japanese Patent Unexamined Publication No. 2001-223219 bulletin The crystalline semiconductor film can be obtained after performing such a gettering step.

This gettering step, however, has disadvantages that the number of processes and the cost increase.

In addition, there is a problem of an etching residue when the gettering site is removed in the gettering step.

Consequently, it is an object of the present invention to provide a method for removing the metal element from the semiconductor film by a different method from the gettering step.

In the present invention made in view of the above problems, the metal element is removed by the following step. Initially, the semiconductor film is irradiated with pulsed laser light so that the metal element segregates in a ridge. After that, the metal element segregated in the ridge is etched away.

Particularly in the present invention, when a silicon-based film (hereinafter referred to as a silicon film) is used as the semiconductor film and Ni element (Ni) is added as the metal element thereto, nickel silicide segregates in the ridge formed on the silicon film by irradiating the pulsed laser light thereto. Next, the nickel silicide segregated in the ridge is removed with the use of etching solution of hydrofluoric acid based etchant. Solution including surface-active agent is preferable as the etching solution of hydrofluoric acid based etchant.

It is noted that not only Ni, but also one kind or plural kinds selected from the group consisting of iron (Fe), cobalt (Co), palladium (Pd), platinum (Pt), copper (Cu), gold (Au), silver (Ag), indium (In), and tin (Sn) can be used as the metal element.

As the laser for segregating the metal element in the ridge, it is possible to use a pulse oscillation laser selected from the group consisting of an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser.

In the case where the surface of the semiconductor film is rough after removing the metal element such as NiSi by etching, the laser light may be irradiated to the semiconductor film under the inert atmosphere in order to flatten the surface of the semiconductor film.

As the laser that can be used in the flattening process, there are an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser, each of which is a pulse oscillation.

In the present invention, the step for removing the metal element such as NiSi may be combined with the step forming the gettering site.

The metal element can be removed without forming an another gettering site by removing the ridge with the metal element typified by Ni segregated therein. When the metal element further segregates, the metal element hardly exists outside the ridge, and therefore it can be removed efficiently. In other words, because there is only a small amount of metal elements remained in the semiconductor film, the device property of the thin film transistor is not adversely affected.

A laser irradiation apparatus for performing such a laser irradiation has a laser resonator, means for shaping laser light emitted from the laser resonator into linear laser, and means for moving an irradiated object and the laser light relatively.

It is noted that the term "linear" herein used does not mean a line strictly but means a rectangle (or an oblong) with a large aspect ratio. For example, the rectangular shape having an aspect ratio of 2 or more (preferably in the range of 10 to 10000) is referred to as linear though the linear is still included in the rectangular.

It is noted that the ridges in the crystalline semiconductor film thus formed align regularly in one direction. More specifically, the ridges are aligned in the scanning direction of the laser light at an interval nearly equal to the wavelength of the laser light. Therefore, it is predicted that the crystal grains are also formed in order.

When a thin film transistor is formed using such a crystalline semiconductor film, the thin film transistor having uniform electrical characteristic can be manufactured. In addition, when the channel-forming region is formed in such a way that the direction of the crystal grain conforms to the direction in which the current flows, the mobility of the thin film transistor can be improved.

Moreover, the distance between the ridges, which is the distance between the crystal grains, is extremely short, which is almost equal to the wavelength of the irradiated laser light. Therefore, there is a plurality of crystal grains in the channel-forming region and thus it is possible to decentralize the adverse effect in the crystal grain boundaries and to improve it compared with the case where the number of crystal grains is small.

[Advantageous Effect of the Invention]

According to the present invention, it is possible to form the crystalline semiconductor film having the crystal grain formed in order with which a thin film transistor having uniform electrical characteristic can be manufactured. In addition, the mobility of the thin film transistor can be improved when the channel-forming region is formed by conforming the direction of the crystal grain with the direction in which the current flows.

Moreover, the distance between the ridges, which is the distance between the crystal grains, is extremely short, which is almost equal to the wavelength of the laser light to be irradiated. For this reason, a plurality of crystal grains exist in the channel-forming region and therefore the adverse effect in the crystal grain boundary can be improved compared with the case in which the number of crystal grains is small.

In addition, the gettering step can be performed without forming an another gettering site by removing the ridge in which the metal element typified by Ni segregates. When the metal element further segregates, the metal element hardly exists outside the ridge and therefore the gettering can be performed efficiently.

DETAILED DESCRIPTION OF THE INVENTION

Figure 1A:
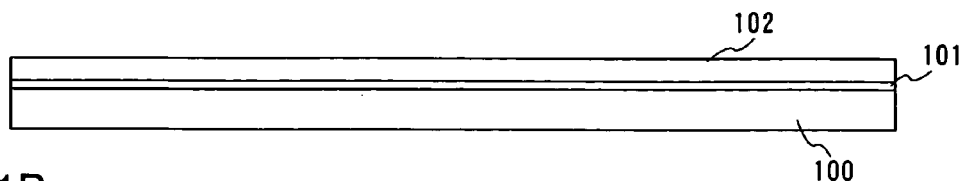
FIGS. 1A to 1G are drawings which illustrate a method for manufacturing a crystalline semiconductor film according to the present invention.

Embodiment modes and embodiments of the present invention is hereinafter explained based on drawings. However, since the present invention can be embodied in many different modes, it is easily understood by those skilled in the art that the modes and the details of the present invention can be changed and modified in various ways unless such changes and modifications depart from the scope and the content of the present invention hereinafter defined. Therefore, the present invention is not limited to the description of the embodiment modes and the embodiments. In addition, the same reference numeral is given to the same part or the part having the similar function throughout the drawings for explaining the embodiment modes and the embodiments. And the explanation to such a part will not be repeated.

EMBODIMENT MODES

Embodiment Mode 1

The present embodiment mode explains a method for manufacturing a crystalline semiconductor film in detail.

Initially, as shown in FIG. 1A, a base film 101 is formed on a substrate 100 having an insulating surface. A glass substrate such as a barium borosilicate glass or an alumino borosilicate glass, a quartz substrate, an SUS substrate, or the like can be used as the substrate 100. In addition, although the substrate made of flexible synthetic resin such as acrylic or plastic typified by PET (polyethylene terephthalate), PES (polyethersulfone), or PEN (polyethylene naphthalate) is usually inferior to the above substrates in terms of the resistance against the heat, the substrate made of flexible synthetic resin can be utilized when it can resist against the heat generated in the manufacturing steps.

The base film 101 is provided in order to prevent that alkali-earth metal or alkali metal such as Na included in the substrate 100 diffuses into the semiconductor film to have an adverse affect on a characteristic of a semiconductor element. Therefore, the base film is formed of an insulating film such as silicon oxide, silicon nitride, or silicon nitride oxide which can suppress the diffusion of the alkali-earth metal and alkali metal into the semiconductor film. In the present embodiment mode, a silicon nitride oxide film is formed in a thickness from 10 to 400 nm (preferably from 50 to 300 nm) by plasma-CVD. It is noted that the base film 101 may have a laminated structure and it may be formed by laminating a silicon oxynitride film (composition ratio: Si=32%, O=27%, N=24%, H=17%) formed in a thickness from 50 to 200 nm (preferably from 100 to 150 nm) on a silicon oxynitride film (composition ratio: Si=32%, O=59%, N=7%, H=2%) formed in a thickness from 10 to 200 nm (preferably from 50 to 100 nm). It is noted that in the case of using the substrate including the alkali metal or the alkali-earth metal in any way such as the glass substrate, the SUS substrate, or the plastic substrate, it is effective to provide the base film in terms of preventing the diffusion of the impurity. However, when the diffusion of the impurity does not lead to any significant problems, for example when the quartz substrate is used, the base film is not always necessary to be provided.

An amorphous semiconductor film 102 is formed on the base film 101. The film thickness of the amorphous semiconductor film 102 is set in the range of 25 to 100 nm (preferably in the range of 30 to 60 nm). In addition, not only silicon but also silicon germanium can be used as the amorphous semiconductor and both of them are collectively referred to as the silicon-based semiconductor film. In addition, when silicon germanium is used, the concentration of germanium is preferably in the range of 0.01 to 4.5 atmic %.

Figure 1B:
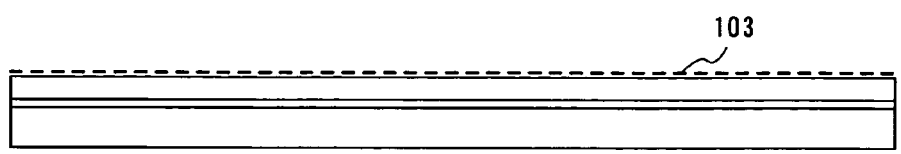

Next, as shown in FIG. 1B, a metal element is added in the amorphous semiconductor film 102. Adding the metal element herein means forming the metal element on the surface of the amorphous semiconductor film 102 so that at least the crystallization is promoted. For example, Ni solution (including aqueous solution and acetic acid medium) is applied on the amorphous semiconductor film 102 by an application method such as a spin coat method or a dip method to form a film 103 including Ni (however, this film is so thin that it may not be observed). On this occasion, in order to improve wettability of the surface of the amorphous semiconductor film 102 and to coat all over the surface thereof with the Ni solution, it is desirable to form an oxide film (not shown diagrammatically) in a thickness from 10 to 50 Å by UV light radiation in the oxygen atmosphere, by a thermal oxidation method, by a process using ozone water including hydroxyl radical or using hydrogen peroxide, or the like. Alternatively, Ni can be added to the amorphous semiconductor film in such a way that a Ni ion is injected by an ion implantation process, that the heat treatment is performed in the water vapor atmosphere including Ni, or that the sputtering is performed using Ni material as a target under Ar plasma. In the present embodiment mode, the aqueous solution including Ni acetate by 10 ppm is applied by the spin coat method.

After that, the amorphous semiconductor film 102 is heated at temperatures ranging from 500 to 550° C. for 2 to 20 hours to crystallize the amorphous semiconductor film so that a crystalline semiconductor film is formed. On this occasion, it is preferable to change the heating temperature gradually. This is because the initial low-temperature heat treatment can dehydrogenate the amorphous semiconductor film, thereby reducing the roughness of the film in the crystallization. In addition, a magnetic field may be applied to crystallize the semiconductor film in combination with its magnetic energy, or a microwave of high output may be also used. In the present embodiment mode, the heat treatment is performed at a temperature of 550° C. for four hours after a heat treatment at a temperature of 500° C. for one hour using a vertical furnace.

Figure 1C:
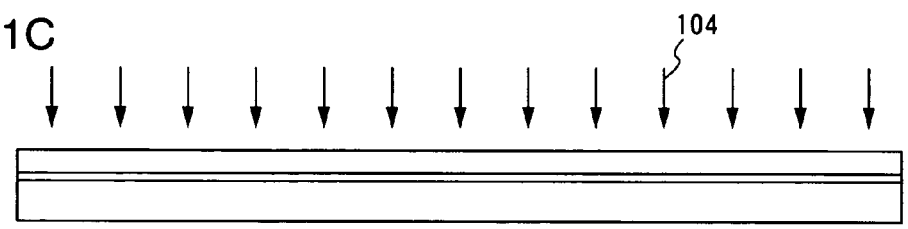

Next, after etching away the oxide film formed on the surface of the crystalline semiconductor film using hydrofluoric acid based etchant, pulsed laser light 104 is irradiated to the amorphous semiconductor film 102 as shown in FIG. 1C. In the present embodiment mode, a pulsed excimer laser (XeCl, emission wavelength 308 nm) is irradiated under the conditions with the energy density set to 420 mJ/cm$^2$ and the number of shots set to 40.

Figure 1D:
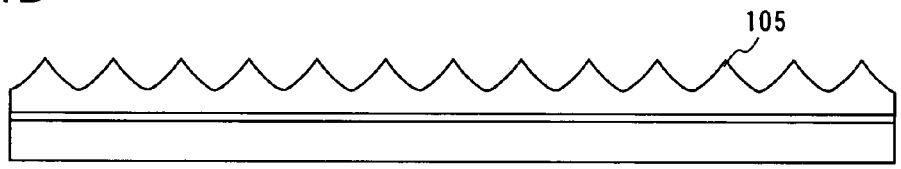
Figure 1E:
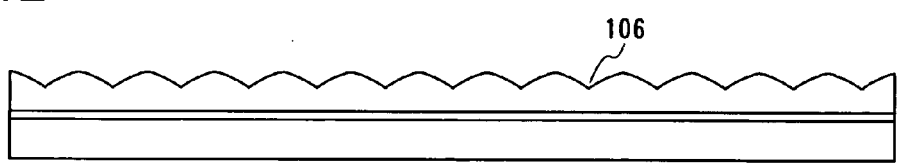

By this laser irradiation, a convex portion 105 referred to as the ridge is formed in order on the surface of the crystalline semiconductor film as shown in FIG. 1D. It is noted that forming the ridges in order means forming the crystal grains in order. The principle that the ridges are aligned will be described in Embodiment 1. The size of the ridge depends upon the conditions in the laser irradiation. Specifically, the size thereof grows as the energy density and the number of shots increase.

The metal element for promoting the crystallization segregates in the ridge. For example, when the crystalline silicon film is formed using Ni as the metal element, nickel silicide segregates in the ridge. As thus described, when nickel silicide segregates in the ridge of the crystalline silicon film, Ni no longer exists outside the ridge as shown in Embodiment 2 and therefore the metal element typified by Ni can be removed efficiently.

And the ridge with the metal element segregated therein is removed by wet etching, dry etching, or polishing with the use of a CMP (Chemical Mechanical Polishing) method. For example, in the case of segregating nickel silicide, it is removed by wet etching with the use of etching solution of hydrofluoric acid based etchant. It is preferable that the etching solution of hydrofluoric acid based etchant includes the surface-active agent. In this embodiment mode, the ridge with nickel silicide segregated therein is removed in such a way that it is soaked in FPM solution (the solution in which hydrogen peroxide water is added to hydrofluoric acid based etchant) and then it is soaked in the mixed solution (product made by Stella Chemifa Corporation, trade name LAL500) including ammonium hydrogen fluoride ($NH_4HF_2$) for 7.13% and ammonium fluoride ($NH_4F$) for 15.4%, and thereafter it is washed with running water. It is noted that although there might be some influence by removing the ridge, the crystal grains are still formed in order.

Then, there is formed a hole (concave portion) 106 (a diameter from 0.7 to 1 μm) when the ridge is removed. This hole 106 emphasizes the convexity and concavity on the surface of the crystalline semiconductor film. When the thin film transistor is manufactured using this crystalline semiconductor film, the leak current might increase and the withstand pressure of the gate might decrease.

Figure 1F:
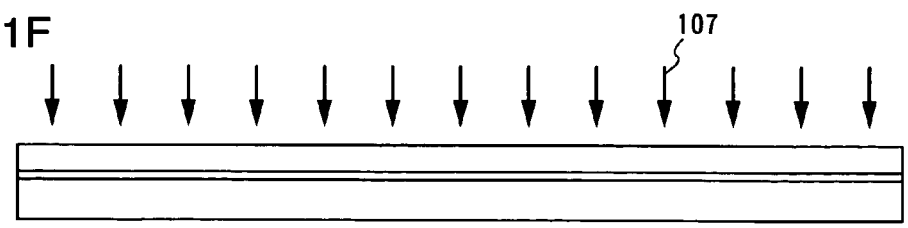

Consequently, the flattening process is performed in order to flatten the surface of the crystalline semiconductor film as shown in FIG. 1F. On this occasion, the laser light 107 is irradiated in the gas atmosphere with no oxygen existing, that is to say, the inert gas atmosphere. In the present embodiment mode, the flattening process is performed in such a way that a pulsed excimer laser (XeCl, emission wavelength 308 nm) is irradiated under conditions with the energy density set to 480 mJ/cm$^2$ and the number of shots set to 12. Alternatively, the flattening process can be performed in such a way that the laser light is irradiated for only one shot to one region, that is to say, the laser light is not overlapped in one region. It is noted that the surface of the crystalline semiconductor film may be flattened by polishing it with the use of the CMP (Chemical Mechanical Polishing) method. In addition, when the flatness of the surface of the crystalline semiconductor film does not lead to any significant problems, this flattening process is not necessary. Although the flattening process may have some influence, the crystal grains are still formed in order.

The crystalline semiconductor film to which such a flattening process is performed is preferable in the case for forming a capacitance element having a semiconductor film. This is because the flattening process can prevent the capacitance element from short-circuiting.

This can suppress the roughness of the surface of the semiconductor and suppress the variation of the threshold value due to the variation of the interface state density.

After that, the gettering step may be performed by heating the amorphous semiconductor film with the inert element doped which becomes a gettering site.

Alternatively, the gettering step may be performed in such a way that the element is injected into a part of an impurity region to form the gettering site and then it is heated.

Figure 1G:
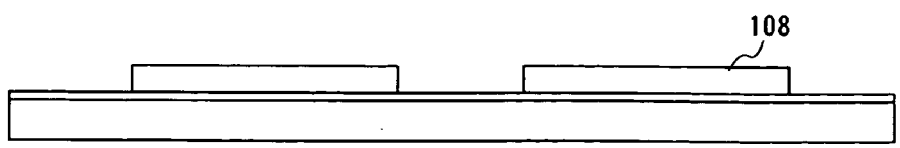

The crystalline semiconductor film thus formed is patterned into a predetermined shape as shown in FIG. 1G, thereby forming an island-shaped crystalline semiconductor film 108. After that, the thin film transistor having this crystalline semiconductor film can be formed.

And, a semiconductor device having the thin film transistor can be manufactured. The semiconductor device is, for example, an integrated circuit or a semiconductor display device. Particularly, the thin film transistor of the present invention can be applied to the pixel portion and the driver circuit of the semiconductor display device such as a liquid crystal display device, a light-emitting device having a light-emitting element, typically an organic light-emitting element, equipped in each pixel, a DMD (Digital Micromirror Device), a PDP (Plasma Display Panel), or an FED (Field Emission Display).

In addition, since the present invention can make the crystal grain in the crystalline semiconductor film small, it is preferably used as the thin film transistor of CPU having the integrated circuit.

As thus described, it is possible to form the crystalline semiconductor film having the crystal grains formed in order. When the thin film transistor is formed using such a crystalline semiconductor film, the thin film transistor having uniform electrical characteristic can be manufactured. In addition, it is possible to improve the mobility of the thin film transistor by forming the channel-forming region so that the direction of the crystal grain conforms to the direction in which the current flows.

Moreover, the distance between the ridges, which is the distance between the crystal grains, is almost equal to the wavelength of the laser light to be irradiated and they are formed in order at extremely short intervals. For this reason, a plurality of the crystal grains exist in the channel-forming region, and this makes it possible to decentralize the adverse effect in the crystal grain boundaries and to improve it compared with the case where the number of crystal grains is small.

In addition, when the ridge with the metal element typified by Ni segregated therein is removed, the metal element can be removed without forming an another gettering site. When the metal element further segregates, the metal element hardly exists outside the ridge, and therefore the metal element can be removed efficiently.

Embodiment Mode 2

The present embodiment mode explains a method for manufacturing a crystalline semiconductor film which is different from the embodiment mode 1.

Figure 4A:
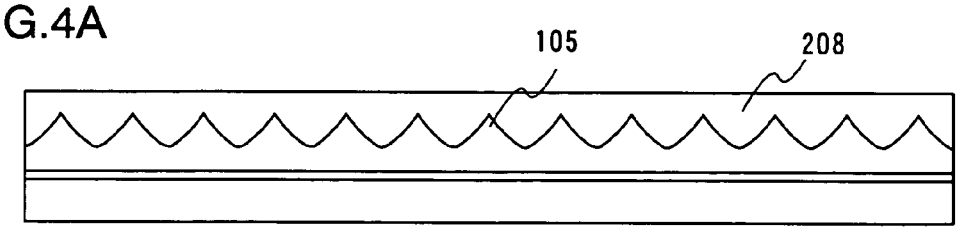
FIGS. 4A to 4C are drawings which illustrate a method for manufacturing a crystalline semiconductor film according to the present invention.

In FIG. 4A, an amorphous semiconductor film 208 having the inert element such as Ar doped is formed with the metal element segregated in the ridge and then the heat treatment is performed thereto. Before the amorphous semiconductor film 208 is formed, it is preferable to form an oxide film so that wettability is improved and that the film is not peeled. Consequently, the present embodiment mode utilizes the oxide film formed when the metal element is segregated by irradiating the laser light to the crystalline semiconductor film as shown in FIG. 1C. Therefore, the amorphous semiconductor film 208 is formed without removing the oxide film.

After that, the amorphous semiconductor film 208, the oxide film, and the ridge 105 are removed by wet etching, dry etching, or polishing with the use of the CMP (Chemical Mechanical Polishing) method. For example, they are removed by the wet etching with the use of the etching solution of hydrofluoric acid based etchant. It is preferable that the surface-active agent is included in the etching solution of hydrofluoric acid based etchant.

Figure 4B:
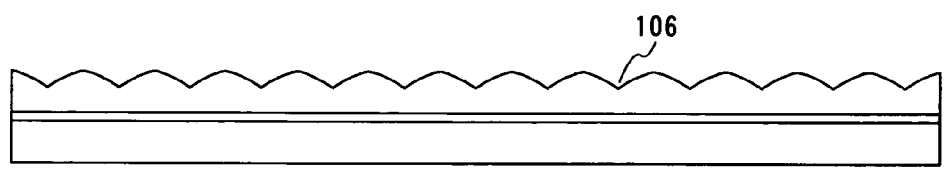
Figure 4C:
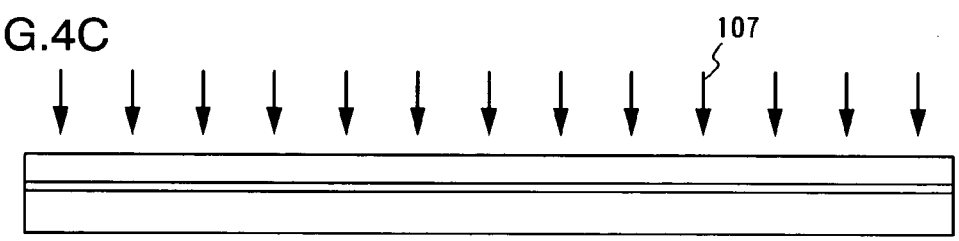

Then, there is formed a depression (a concave portion) 106 having a diameter from 0.7 to 1 μm when the ridge is removed as shown in FIG. 4B. Therefore, the flattening process is performed as shown in FIG. 4C in order to flatten the surface of the crystalline semiconductor film. On this occasion, laser light 107 is irradiated in the gas atmosphere with no oxygen existing or the inert gas atmosphere. It is noted that the surface of the crystalline semiconductor film may be flattened by polishing it with the use of the CMP (Chemical Mechanical Polishing) method. When the flatness of the surface of the crystalline semiconductor film does not lead to any significant problems, the flattening process is not necessary. It is noted that although the flattening process may have some influence, the crystal grains are still formed in order.

This can suppress the roughness of the surface of the semiconductor and the variation of the threshold value due to the variation of the interface state density.

Since the metal element can be gettered in the amorphous semiconductor film 208, it is preferable for this embodiment mode to be employed particularly in the case where the crystallization is performed using a large amount of metal elements.

Embodiment Mode 3

The present embodiment mode explains a multi-chamber apparatus having a laser irradiation apparatus and an optical system in the laser irradiation apparatus.

Figure 2A:
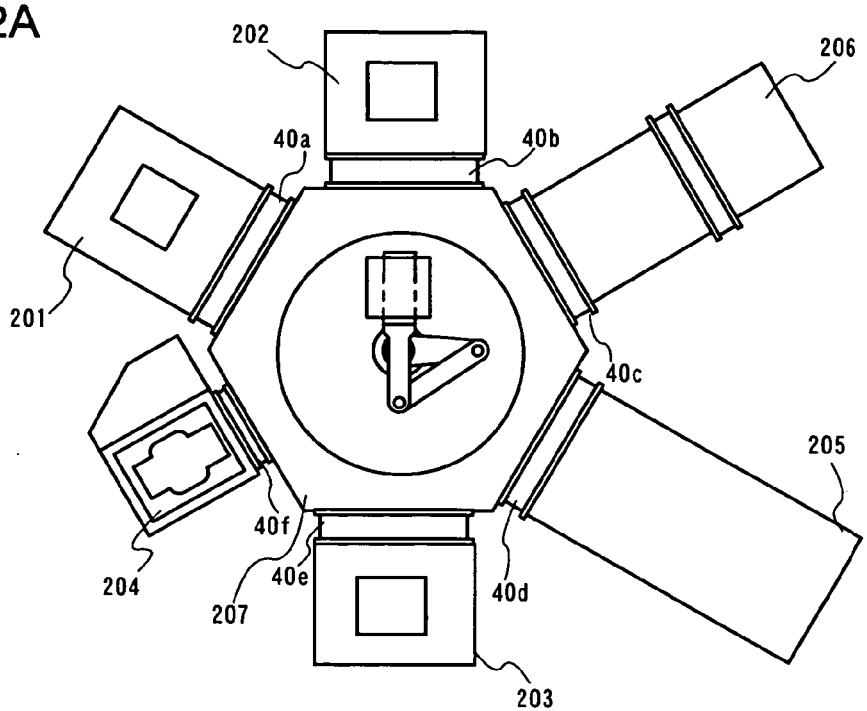
FIGS. 2A and 2B are drawings which illustrate a laser irradiation apparatus according to the present invention.

FIG. 2A shows a multi-chamber apparatus having a first treatment chamber 201 in which the processes up to forming an amorphous semiconductor film can be performed, a second treatment chamber 202 in which a metal element can be added, a third treatment chamber 203 in which a heat treatment can be performed, an unload chamber 204 for taking out a substrate, a laser irradiation chamber 205 in which the laser irradiation is performed, and a load chamber 206 in which the substrate can be stored, all of which are provided so as to encircle a transfer chamber 207. And these chambers are connected to the transfer chamber 207 with transferring gates 40a to 40f respectively interposed therebetween. As thus described, since these chambers are provided around the transfer chamber having transferring means, transportation distance and transportation time can be shortened.

The first treatment chamber 201 has an electrode, a high frequency power supply, a vacuum pump, and a gas supply port in order to perform the plasma-CVD process. It is possible to form the base film and the amorphous semiconductor film continuously preferably by making the gas to be supplied different.

The second treatment chamber 202 has, for example, a nozzle for applying the aqueous solution including the metal element and has means for rotating the substrate.

The third treatment chamber 203 has a system for controlling the heating temperature, thereby increasing the temperature gradually.

In addition, the atmosphere in each treatment chamber and the laser irradiation chamber can be controlled. For example, the pressure in the chamber can be reduced or the chamber can have the inert atmosphere.

Throughput can be improved by using such a multi-chamber apparatus. Moreover, when a plurality of multi-chamber apparatus like this are provided, the substrate can be processed without interrupting the step even when the maintenance is being done to one of the chambers.

It is noted that the laser irradiation chamber of the present embodiment mode may have means for adding the metal element.

Figure 2B:
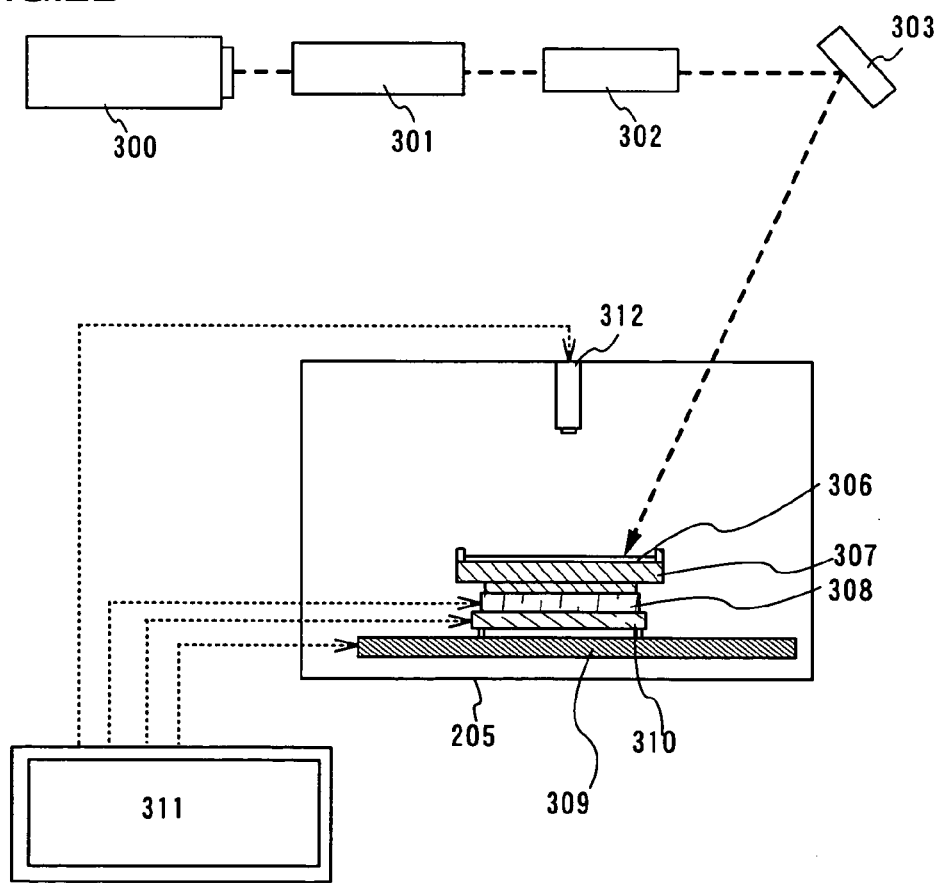

In FIG. 2B, laser light oscillated from a laser resonator 300 is incident into a beam expander 301. The beam expander 301 suppresses the divergence of the incident laser light and adjusts the size of the cross section of the beam.

A cross section of the beam emitted from the beam expander 301 is shaped into rectangular, elliptical, or linear through a cylindrical lens 302.

And, the laser light is reflected by a mirror 303 and is converged so as to be linear. After that, it is irradiated to a processing object 306 in the laser irradiation chamber 205.

In other words, the beam expander, the cylindrical lens, and the mirror correspond to one means for shaping the laser light into linear.

In the laser irradiation chamber 205, the processing object 306 is set on the stage 307 whose position is controlled by uniaxial robots 308 to 310 to become means for controlling the position. Specifically, the uniaxial robot 308 for Φ axis can rotate the stage 307 in the horizontal surface and can tilt the stage 307 from the horizontal surface. In addition, the stage itself may be tilted. The oblique laser irradiation can be also performed by fixing the irradiated object on the stage obliquely.

The uniaxial robot 309 for X axis can move the stage 307 in X-axis direction. The uniaxial robot 310 for Y axis can move the stage 307 in Y-axis direction. And, the processing object is scanned in X direction while irradiating the linear beam spot extended long in Y-axis direction. It is a central processing device 311 that controls the operation of each means for controlling the position. The uniaxial robot for X-axis and the uniaxial robot for Y-axis correspond to one means for moving the irradiated object and the laser light relatively.

When the pulsed laser light is employed, it is preferable to set the feed pitch of the substrate per a pulse in the range of 1 to 30 μm.

It is noted that a monitor 312 with the use of a photo detector such as CCD may be provided in order to know the exact position of the processing object 306.

In addition, impurity contamination to the semiconductor film can be reduced by removing the oxide film just before the laser light is irradiated in the laser irradiation chamber.

With such a system of the laser irradiation apparatus, the laser processing based on the exact position control can be performed. Moreover, it is possible to fix the stage so that the processing object is set horizontally or on a tilt and to perform the laser irradiation vertically or obliquely. In addition, the stage itself may be tilted.

Embodiment Mode 4

The present embodiment mode explains a light-emitting device, one example of the semiconductor devices having the crystalline semiconductor film.

Figure 3A:
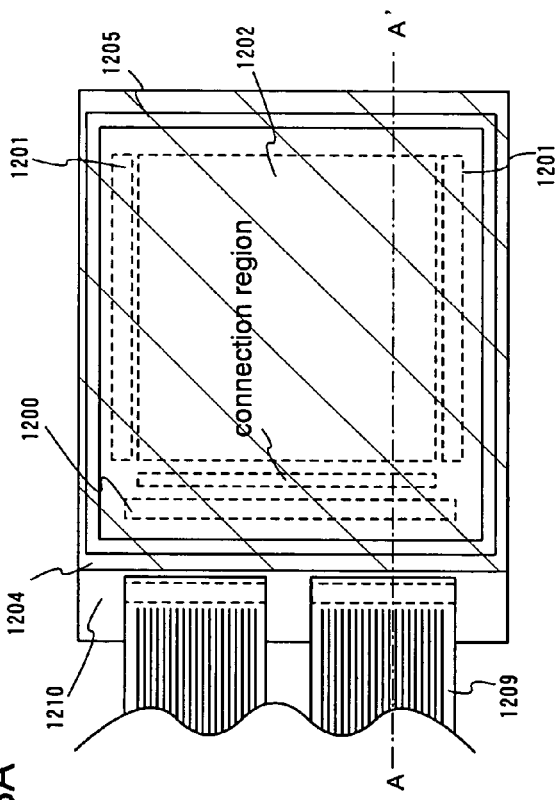
FIGS. 3A and 3B are drawings which illustrate a light-emitting device having the crystalline semiconductor film manufactured by the present invention.

FIG. 3A shows a light-emitting device in which a signal line driver circuit 1200, a scanning line driver circuit 1201, and a pixel portion 1202 are formed on a first substrate 1210.

Figure 3B:
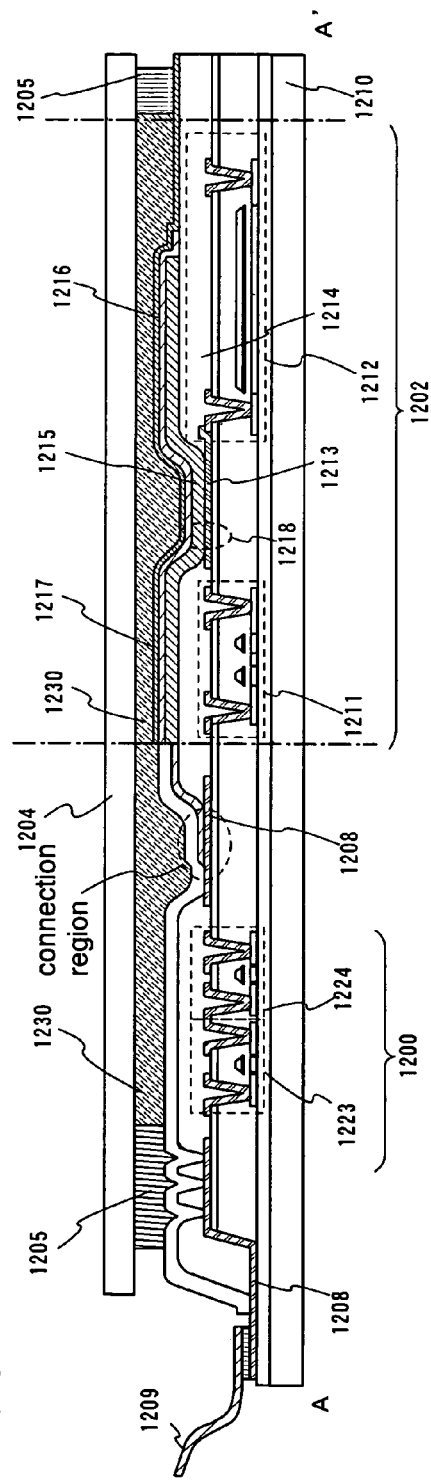

FIG. 3B is a cross-sectional view of the display device taken along A-A', which illustrates the signal line driver circuit 1200 equipped with a CMOS circuit having an n-channel TFT 1223 and a p-channel TFT 1224 on the first substrate 1210. The n-channel TFT 1223 and the p-channel TFT 1224 are formed using the crystalline semiconductor film of high quality obtained simply by removing the metal element segregated in the ridge. TFT forming the signal line driver circuit 1200 and the scanning line driver circuit 1201 may be formed by the CMOS circuit, a PMOS circuit, or an NMOS circuit.

The pixel portion 1202 has a switching TFT 1211 and a driver TFT 1212. The switching TFT 1211 and the driver TFT 1212 have the crystalline semiconductor film of high quality obtained simply by removing the metal element segregated in the ridge. In addition, TFT of the pixel portion 1202 does not need high crystallinity compared to those of the signal line driver circuit 1200 and the scanning line driver circuit 1201. In addition, the pixel portion 1202 has an insulator 1214 which covers a portion of the first electrode 1213 of the light-emitting element connected electrically to one electrode of the driver TFT 1212. And the insulator 1214 covers the switching TFT 1211 and the driver TFT 1212. In addition, the insulator 1214 has an opening in the position corresponding to the first electrode 1213 of the light-emitting element. The pixel portion 1202 also has a light-emitting element 1218 in which the electroluminescent layer 1215 is provided on the first electrode 1213 and the second electrode 1216 of the light-emitting layer is provided on the electroluminescent layer 1215. It is noted that the electroluminescent layer is formed of an organic material or an inorganic material, and it is constituted by combining an electron injecting layer, an electron transporting layer, a light emitting layer, a hole transporting layer, a hole injecting layer, and the like appropriately.

The insulator 1214 may be formed of an organic resin film such as resist, polyimide, or acrylic, or may be formed of an inorganic insulating film including silicon such as silicon nitride or silicon oxide. Here, the insulator 1214 is formed of a positive photosensitive acrylic resin film. In the case of using the organic resin film or the like, it is preferable to form an insulating film including silicon nitride or silicon nitride oxide as its main component or to form a DLC (Diamond Like Carbon) film including hydrogen in order to prevent moisture or oxygen from penetrating thereinto.

It is noted that in order to improve the coverage to the step of the electrode or the electroluminescent layer to be formed afterward, it is preferable to form the insulator 1214 so as to have radius of curvature in its upper part or in its lower part.

For example, when the insulator 1214 is formed of the positive photosensitive acrylic, it is preferable that only the upper part of the insulator 1214 has radius of curvature (in the range of 0.2 to 3 μm). In addition, either a negative type which becomes insoluble in etchant by the irradiation of the light or a positive type which becomes soluble in etchant by the irradiation of the light can be applied as the insulator 1214.

Since the first electrode 1213 of the light-emitting element contacts (electrically connected to) the first electrode of the driver TFT 1212, it is desirable that at least the bottom surface of the first electrode 1213 of the light-emitting element is formed of the material having an ohmic contact with the first electrode region of the semiconductor film and that the surface thereof contacting the electroluminescent layer is formed of the material having high work function. For example, the first electrode 1213 of the light-emitting element may be formed of a single layer of a titanium nitride film or may be formed by laminating three or more layers.

Furthermore, when the first electrode 1213 and the second electrode 1216 of the light-emitting element are formed of a conductive film having translucency, it is possible to manufacture a light-emitting device of double-sided emission type in which the light is emitted both to the substrate side and to the sealing substrate side.

The first electrode 1213 can be formed of a non-translucent conductive film, preferably the conductive film having high reflectivity, and the second electrode 1216 can be formed of a translucent conductive film. This can manufacture a light-emitting device of a top-emission type in which the light is emitted only to the sealing substrate side.

On the contrary, when the first electrode 1213 is formed of the translucent conductive film and the second electrode 1216 is formed of the non-translucent conductive film, preferably the conductive film having high reflectivity, it is possible to manufacture a light-emitting device of a bottom-emission type in which the light is emitted only to the substrate side.

In the case of the top-emission type or the bottom-emission type, the light can be used efficiently by employing the conductive film having high reflectivity as the electrode of the light-emitting element provided in the side to which the light is not emitted.

It is noted that both of the first electrode and the second electrode can be the anode or the cathode according to the pixel structure. For example, when the first electrode is the anode and the second electrode is the cathode, the specific electrode material is explained as follows.

It is preferable to use metal, alloy, conductive compound, a mixture of these, or the like having high work function (work function is 4.0 eV or more) as the anode material. More specifically, ITO (indium tin oxide), IZO (indium zinc oxide) including indium oxide which is mixed with tin oxide (ZnO) in the range of 2 to 20%, gold (Au), platinum (Pt), nickel (Ni), tungsten (W), chromium (Cr), molybdenum (Mo), iron (Fe), cobalt (Co), copper (Cu), palladium (Pd), or the metallic nitride material such as TiN can be used as the anode material.

On the other hand, it is desirable to use metal, alloy, conductive compound, a mixture of these, or the like having low work function (work function is 3.8 eV or less) as the cathode material. Specifically, the cathode can be formed of the material such as the element belonging to the first group or the second group in the periodic table, that is to say, alkali metal such as Li or Cs; alkaline-earth metal such as Ca or Sr; Mg; alloy including these such as Mg:Ag or Al:Li; a chemical compound such as LiF, CsF, or $CaF_2$; or transition metal including rare-earth metal. However, since the cathode needs to have translucency, the cathode is formed by forming these metals or the alloy including these metals extremely thinly and by laminating the metal (including alloy) such as ITO thereon. These anode and cathode can be formed by the vapor deposition method, the sputtering method, or the like.

In addition, when the full-color display is performed, the electroluminescent layer 1215 is formed in such a way that the materials each showing the red (R), the green (G), and the blue (B) color emission are formed selectively by the vapor deposition method with the use of the respective deposition masks or by an ink-jetting method. Specifically, CuPc or PEDOT is employed as HIL, α-NPD is employed as HTL, BCP or $Alq_3$ is employed as ETL, BCP:Li or $CaF_2$ is employed as EIL respectively. In addition, $Alq_3$ doped with dopant in accordance with the respective colors of R, G, and B (DCM or the like in the case of R, DMQD or the like in the case of G) may be employed as EML.

More specific laminated structure of the electroluminescent layer 1215 is explained as follows. In the case of forming the electroluminescent layer showing red color emission, for example, CuPc is formed 30 nm in thickness and then α-NPD is formed 60 nm in thickness. After that, the same mask is used to form $Alq_3$ with $DCM_2$ and rubrene added 40 nm in thickness as a red light-emitting layer, to form BCP 40 nm in thickness as an electron transporting layer, and to form BCP with Li added 1 nm in thickness as an electron injecting layer. In addition, in the case of forming the electroluminescent layer showing green color emission, for example, CuPc is formed 30 nm in thickness and then α-NPD is formed 60 nm in thickness. After that, the same vapor deposition mask is used to form $Alq_3$ with coumarin 545T added 40 nm in thickness as the green light-emitting layer, to form BCP 40 nm in thickness as the electron transporting layer, and to form BCP with Li added 1 nm in thickness as the electron injecting layer. In addition, in the case of forming the electroluminescent layer showing blue color emission, for example, CuPc is formed 30 nm in thickness and then α-NPD is formed 60 nm in thickness. After that, the same mask is used to form bis [2-(2-hydroxyphenyl) benzoxazolate] zinc: $Zn(PBO)_2$ in 10 nm thick as a light-emitting layer. Then, BCP is formed in 40 nm thick as the electron transporting layer and BCP with Li added is formed in 1 nm thick as the electron injecting layer. It is noted that the structure is not limited to the laminated structure of the organic compound layer described above.

Among the electroluminescent layers of these colors, CuPc and α-NPD, which are common to all the layers, can be formed all over the pixel portion. In addition, the mask can be shared among these colors. For example, after forming the red electroluminescent layer, the mask is moved to form the green electroluminescent layer. Then the mask is moved again to form the blue electroluminescent layer. In addition, the order of the electroluminescent layer of each color to be formed may be set appropriately.

In addition, in the case of white light emission, a full color display may be performed by providing a color filter or a color conversion layer separately. The color filter or the color conversion layer may be pasted after providing it to the second substrate.

In order to prevent the light-emitting element from deteriorating due to moisture, oxygen, or the like, there is a protective film 1217 provided so as to cover the second electrode of the light-emitting element. In this embodiment mode, the protective film 1217 is formed of the insulating film including silicon nitride or silicon nitride oxide as its main component obtained by DC sputtering or RF sputtering, or formed of a DLC (Diamond Like Carbon) film including hydrogen.

And as shown in FIGS. 3A and 3B, the second electrode 1216 of the light-emitting element is connected to a connection wiring 1208 through a lead wiring from an opening (contact) provided at the connection region in the insulator 1214. The connection wiring 1208 is electrically connected to a flexible print substrate (FPC) 1209 by anisotropic conductive resin (AFC). And a video signal or a clock signal to become an external input signal is received through the FPC 1209. Although only the FPC is illustrated here, a print wiring board (PWB) may be provided in this FPC.

The present embodiment mode shows the light-emitting device with the driver integrally formed in which the signal line driver circuit 1200 and the scanning line driver circuit 1201 are formed on the first substrate 1210. However, the signal line driver circuit and the scanning line driver circuit may be formed by IC and they may be electrically connected to a signal line or a scanning line by a SOG method or a TAB method.

When ACF (anisotropic conductive resin) is pasted by pressurizing or heating, attention should be paid so that crack is not generated due to the flexibility of the substrate or the softening by the heating. For example, the substrate having high rigidity may be set as a support in the region to be pasted.

In the periphery of the first substrate, there is provided a sealant 1205 with which the first substrate and the second substrate 1204 are pasted, and then they are sealed. It is preferable to use epoxy resin as the sealant 1205. In addition, it is preferable to form resin 1230 in the space formed by pasting the second substrate. Alternatively this space may be filled with nitrogen. As a result, the light-emitting element can be prevented from deteriorating due to moisture or oxygen.

As above, the light-emitting device having a sophisticated thin film transistor can be manufactured.

Embodiment Mode 5

The present embodiment mode explains a liquid crystal display device, one of the semiconductor devices having the crystalline semiconductor film.

Figure 5A:
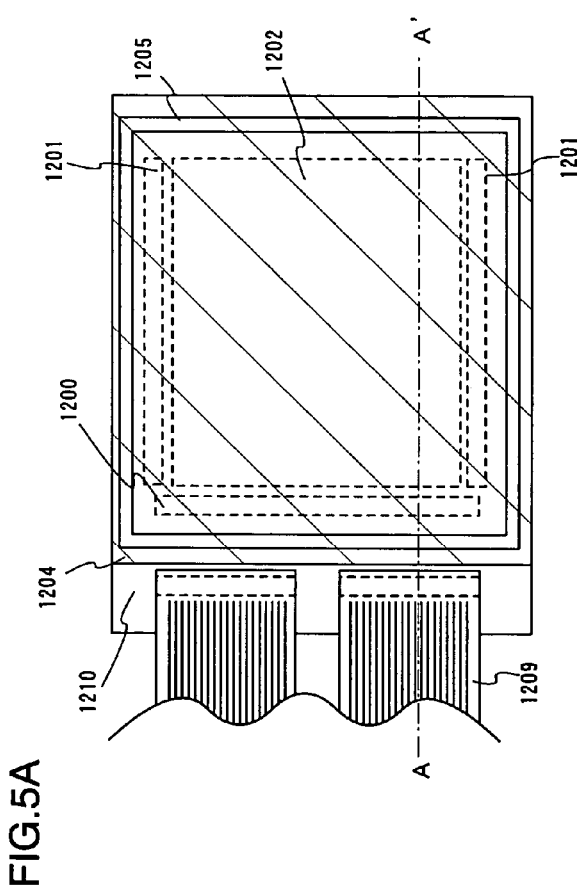
FIGS. 5A and 5B are drawings which illustrate a liquid crystal display device having the crystalline semiconductor film manufactured by the present invention.

FIG. 5A shows a liquid crystal display device in which a signal line driver circuit 1200, a scanning line driver circuit 1201, and a pixel portion 1202 are formed on a first substrate 1210.

Figure 5B:
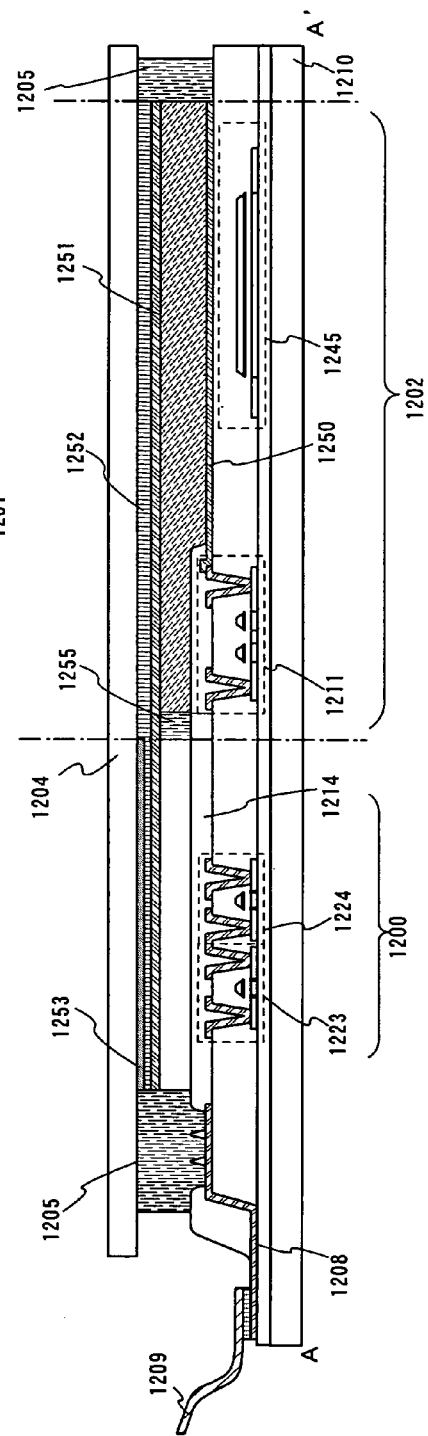

FIG. 5B is a cross-sectional view of the display device taken along A-A', which illustrates the signal line driver circuit 1200 equipped with a CMOS circuit having an n-channel TFT 1223 and a p-channel TFT 1224 on the first substrate 1210. The n-channel TFT 1223 and the p-channel TFT 1224 are formed using the crystalline semiconductor film of high quality obtained simply by removing the metal element segregated in the ridge. TFT forming the signal line driver circuit 1200 and the scanning line driver circuit 1201 may be formed by the CMOS circuit, a PMOS circuit, or an NMOS circuit.

The pixel portion 1202 has the switching TFT 1211 and the capacitance element 1245. The switching TFT 1211 is formed using the crystalline semiconductor film of high quality obtained simply by removing the metal element segregated in the ridge. The capacitance element 1245 is constituted by the gate insulating film sandwiched between the semiconductor film with the impurity added and the gate electrode. It is noted that TFT of the pixel portion 1202 does not need to have high crystallinity compared to those of the signal line driver circuit 1200 and the scanning line driver circuit 1201. The signal line driver circuit 1200 has the n-channel TFT 1223, the p-channel TFT 1224. The pixel portion 1202 has an insulator 1214 and a pixel electrode 1250. The insulator 1214 covers a portion of the pixel electrode 1250 connected to one electrode of the switching TFT 1211.

In the second substrate 1204 to become an opposing substrate, a black matrix 1253 is provided in the position corresponding to the signal line driver circuit 1200, and a color filter 1252 is provided at least in the position corresponding to the pixel portion. The rubbing treatment is performed to the second substrate 1204 with the opposing electrode 1251 formed, and the first substrate 1210 and the second substrate 1204 are pasted with a spacer 1255 interposed therebetween.

A liquid crystal layer is injected between the first substrate 1210 and the second substrate 1204. It is preferable to inject the liquid crystal layer in the vacuum atmosphere. Alternatively, the liquid crystal layer may be delivered by drops into the first substrate 1210 and then the first substrate 1210 may be pasted with the second substrate 1204. In particular, in the case of using the large substrate, delivering the liquid crystal layer by drops is more preferable than injecting it.

The first substrate 1210 and the second substrate 1204 are pasted with the use of the sealant 1205. It is preferable to enhance the contrast by providing a polarizer in the first substrate 1210 and the second substrate 1204 appropriately.

As above, a liquid crystal display device having a sophisticated thin film transistor can be manufactured.

Embodiment Mode 6

As the examples of the electronic instruments manufactured by applying the present invention, there are a digital camera, a sound playback device such as a car audio, a note-type personal computer, a game machine, a personal digital assistant (a mobile phone, a mobile game machine, or the like), an image reproduction device equipped with a recording medium such as a home-use game machine, and the like. FIGS. 7A to 7H illustrate the specific examples of these electronic instruments.

Figure 7A:
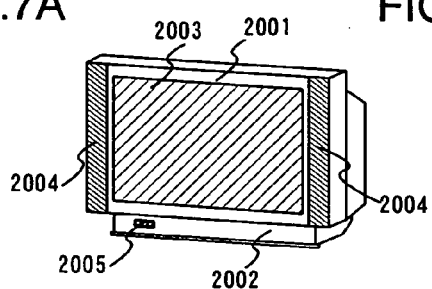
FIGS. 7A to 7H are drawings which illustrate electronic instruments having the crystalline semiconductor film manufactured by the present invention.

FIG. 7A shows a display device including a chassis 2001, a supporting stand 2002, a display portion 2003, a speaker portion 2004, a video input terminal 2005, and the like. The display portion 2003 has a light-emitting element or a liquid crystal element. The display portion 2003 can be formed using the crystalline semiconductor film of high quality obtained simply by removing the metal element segregated in the ridge. As a result, the quality of the display device can be enhanced and its manufacturing cost can be lowered.

Figure 7B:
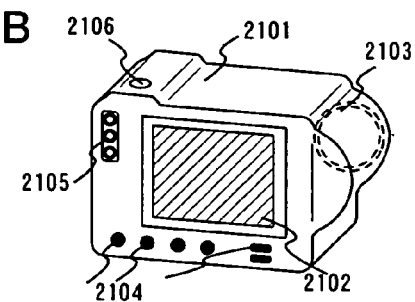

FIG. 7B shows a digital still camera including a main body 2101, a display portion 2102, an image receiving portion 2103, operation keys 2104, an external connection port 2105, a shutter 2106, and the like. The display portion 2102 has a light-emitting element or a liquid crystal element. The display portion 2102 can be formed using the crystalline semiconductor film of high quality obtained simply by removing the metal element segregated in the ridge. As a result, the quality of the digital still camera can be enhanced and its manufacturing cost can be lowered.

Figure 7C:
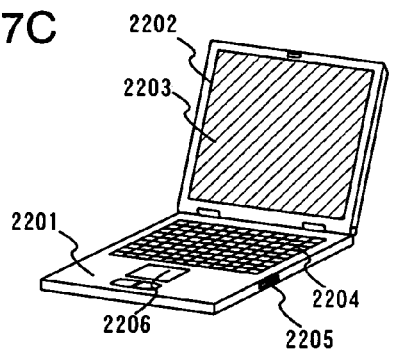

FIG. 7C shows a note-type personal computer including a main body 2201, a chassis 2202, a display portion 2203, a keyboard 2204, an external connection port 2205, a pointing mouse 2206, and the like. The display portion 2203 has a light-emitting element or a liquid crystal element. The display portion 2203 can be formed using the crystalline semiconductor film of high quality obtained simply by removing the metal element segregated in the ridge. As a result, the quality of the note-type personal computer can be enhanced and its manufacturing cost can be lowered.

Figure 7D:
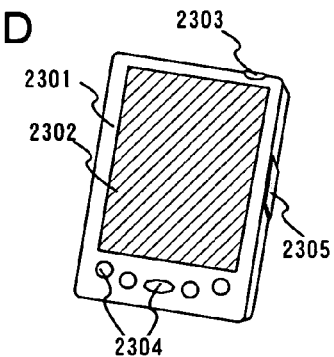

FIG. 7D shows a mobile computer including a main body 2301, a display portion 2302, a switch 2303, operation keys 2304, an infrared radiation port 2305 and the like. The display portion 2302 has a light-emitting element or a liquid crystal element. The display portion 2203 can be formed using the crystalline semiconductor film of high quality obtained simply by removing the metal element segregated in the ridge. As a result, the quality of the note-type personal computer can be enhanced and its manufacturing cost can be lowered.

Figure 7E:
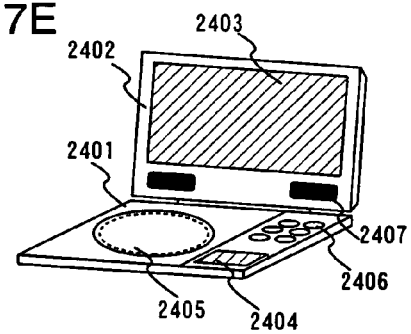

FIG. 7E shows a mobile image reproduction device with a recording medium equipped including a main body 2401, a chassis 2402, a display portion A2403, a display portion B2404, a recording medium reader 2405, an operation key 2406, a speaker portion 2407, and the like. The display portion A 2403 mainly displays image information, and the display portion B 2404 mainly displays textual information. The display portion A2403 and the display portion B2404 have a light-emitting element or a liquid crystal element. The display portion A2403 and the display portion B2404 can be formed using the crystalline semiconductor film of high quality obtained simply by removing the metal element segregated in the ridge. As a result, the quality of the image reproduction device can be enhanced and its manufacturing cost can be lowered.

Figure 7F:
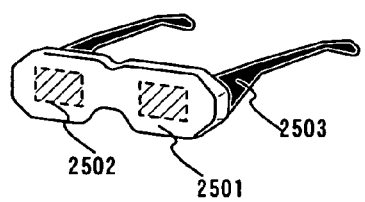

FIG. 7F shows a goggle-type display including a main body 2501, a display portion 2502, and an arm portion 2503. The display portion 2502 has a light-emitting element or a liquid crystal element. The display portion 2502 can be formed using the crystalline semiconductor film of high quality obtained simply by removing the metal element segregated in the ridge. As a result, the quality of the goggle-type display can be enhanced and its manufacturing cost can be lowered.

Figure 7G:
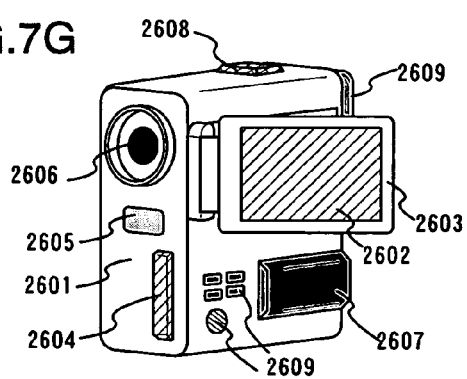

FIG. 7G shows a video camera including a main body 2601, a display portion 2602, a chassis 2603, an external connection port 2604, a remote control receiver 2605, an image receiver 2606, a battery 2607, an audio input portion 2608, operation keys 2609, and the like. The display portion 2602 has a light-emitting element or a liquid crystal element. The display portion 2602 can be formed using the crystalline semiconductor film of high quality obtained simply by removing the metal element segregated in the ridge. As a result, the quality of the video camera can be enhanced and its manufacturing cost can be lowered.

Figure 7H:
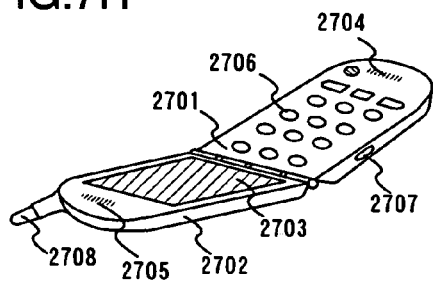

FIG. 7H shows a mobile phone, one of the personal digital assistants, including a main body 2701, a chassis 2702, a display portion 2703, an audio input portion 2704, an audio output portion 2705, an operation key 2706, an external connection port 2707, an antenna 2708, and the like. The display portion 2703 has a light-emitting element or a liquid crystal element. The display portion 2703 can be formed using the crystalline semiconductor film of high quality obtained simply by removing the metal element segregated in the ridge. As a result, the quality of the mobile phone can be enhanced and its manufacturing cost can be lowered.

It is possible to provide the electronic instrument having the sophisticated thin film transistor manufactured according to the present invention. As a result, the quality of the electronic instrument can be enhanced and its manufacturing cost can be lowered.

The present embodiment mode can be combined with any one of the above embodiment modes freely.

EMBODIMENTS

Embodiment 1

This embodiment explains the principle that the ridge is formed so as to are aligned with reference to FIGS. 6A to 6E.

Figure 6A:
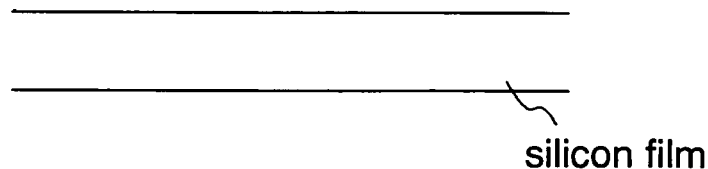
FIGS. 6A to 6E are drawings which illustrate the formation process of the crystalline semiconductor film according to the present invention.

FIG. 6A shows a silicon film before being irradiated by pulsed laser light.

Figure 6B:
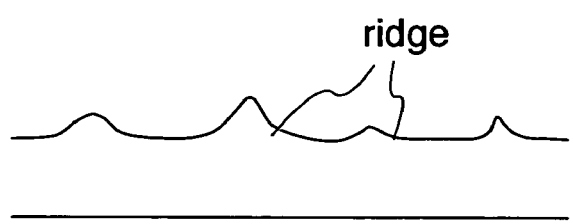

As shown in FIG. 6B, the ridge is formed at the time the pulsed laser light is irradiated for the first shot in the position where the grown crystal grains collide lastly. For example, in the case of forming the silicon film to which the metal element for promoting the crystallization is added and the heat treatment is performed, the ridge is formed in the position where the crystal grains grown from the nucleus formed in the heat treatment collide lastly. When the heat treatment using the metal element is not performed, the ridge is formed in the random position.

Figure 6C:
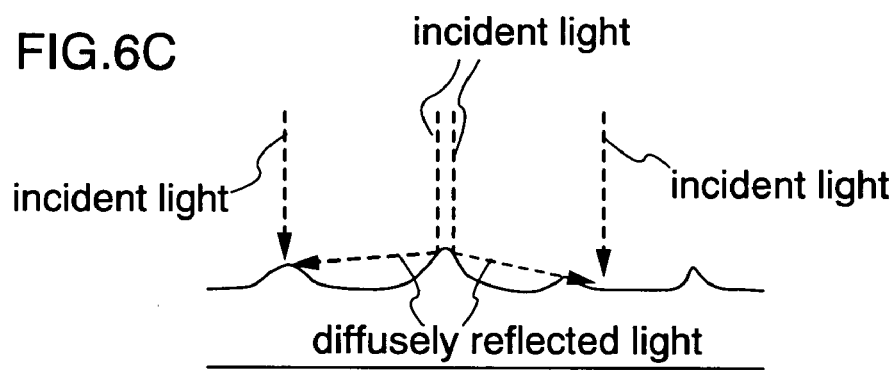

As shown in FIG. 6C, when the pulsed laser light is irradiated for the second shot, scattered light and reflected light (both of them are collectively referred to as diffusely reflected light) increase in the laser irradiation because of the concavity and convexity due to the ridge on the surface of the silicon film, which results in the interference between the incident light and the diffusely reflected light.

Figure 6D:
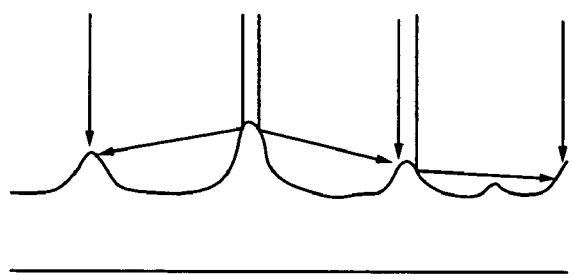
Figure 6E:
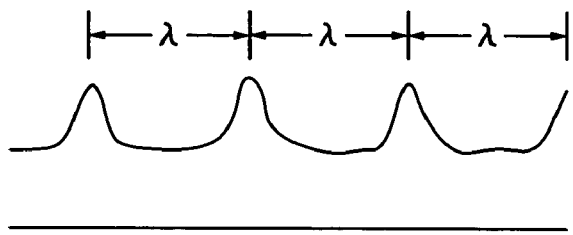

And, as shown in FIG. 6D, when the pulsed laser light is irradiated for the third shot or more, the region where the laser light is reinforced due to the interference is crystallized lastly because the temperature is high. Therefore, the ridge is newly formed in the place where the laser light is reinforced. When the laser light is irradiated further, the ridge produces new diffusely reflected light, which causes the interference in another place.

It is considered that such an interference occurs in all the ridges and the number of ridges increases. And the higher ridge produces the more intense diffusely reflected light. Therefore, when there are two ridges within the wavelength of the pulsed laser light (for example an excimer laser, specifically a XeCl excimer laser, has a wavelength of approximately 0.3 µm), the higher ridge grows as the number of shots increases, while the lower ridge disappears at the time of melting.

For this reason, even though the ridges are formed at random initially, the high ridges come to are aligned as the number of shots of pulsed laser light increases. In addition, when the ridges are aligned to some extent, a temperature distribution becomes more remarkable, which promotes the regular formation of the ridges.

It is considered that the ridge is formed in order as thus described.

Embodiment 2

This embodiment shows the result of observing the condition in which nickel silicide segregates in the ridge.

Figure 8:
FIG. 8 is a TEM photograph of the crystalline semiconductor film manufactured by the present invention.

FIG. 8 is a cross-sectional transmission electron image (TEM photograph) of the ridge formed on the silicon film (crystalline silicon film) crystallized by the pulsed laser light. Reference marks 1 to 3 denote the region with the ridge formed, while reference marks 4 and 5 denote the region with no ridges formed (flat region).

FIGS. 9A to 9C and FIGS. 10A and 10B show the results of EDX measurement at the regions 1 to 5.

Figure 9A:
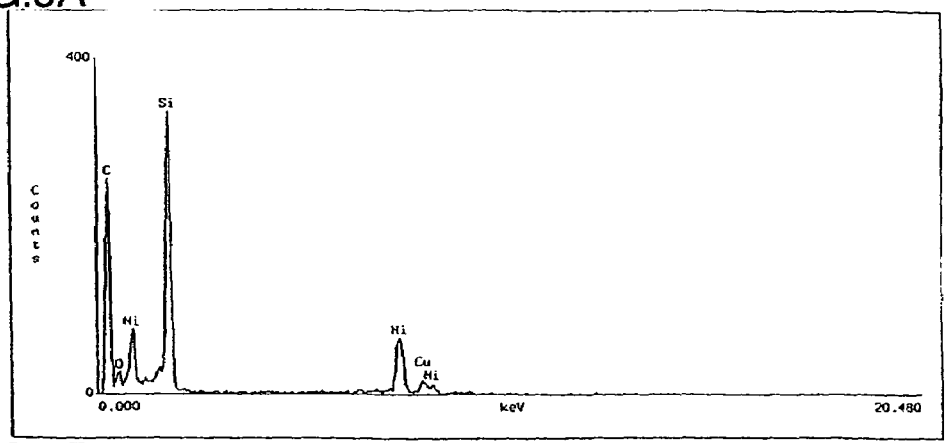
FIGS. 9A to 9C are drawings which show EDX measurement of the crystalline semiconductor film manufactured by the present invention.
Figure 9B:
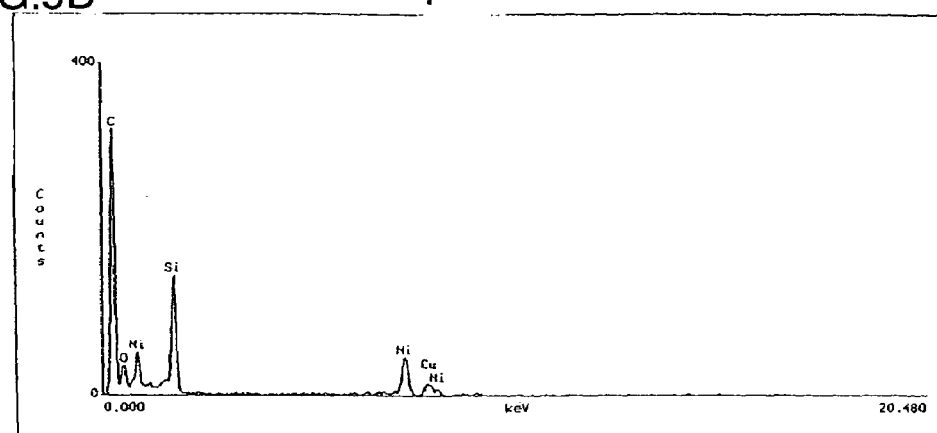
Figure 9C:
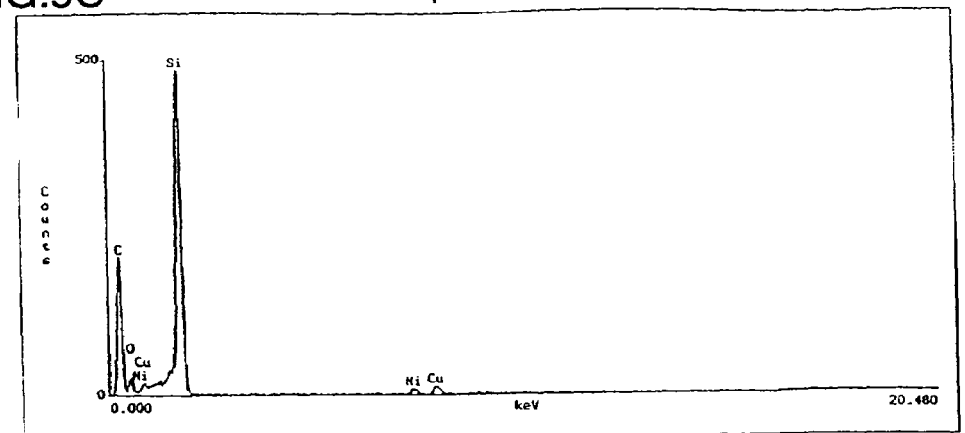
Figure 10A:
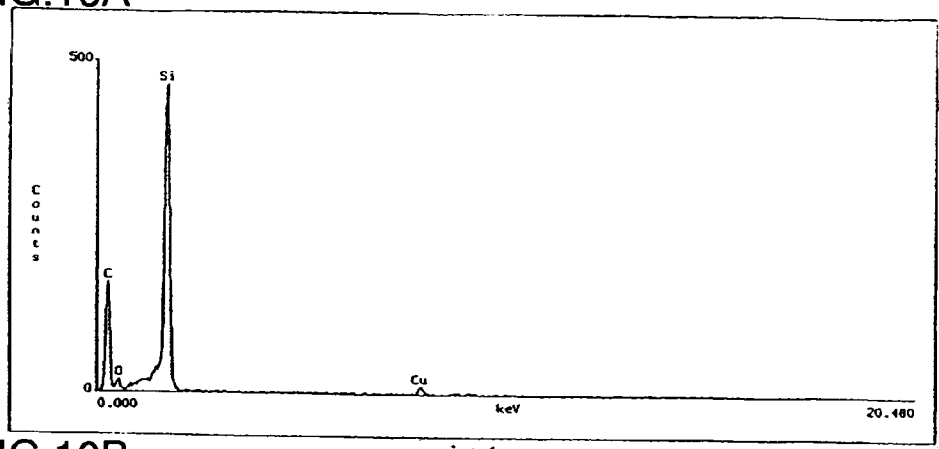
FIGS. 10A and 10B are drawings which show EDX measurement of the crystalline semiconductor film manufactured by the present invention.
Figure 10B:
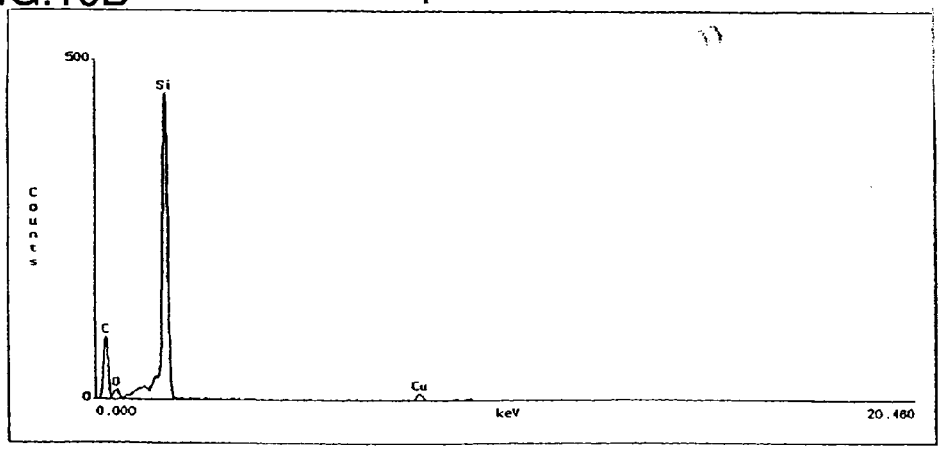

FIGS. 9A to 9C indicate that there is Ni in the regions 1 to 3. On the other hand, FIGS. 10A and 10B indicate that there is no Ni in the regions 4 and 5.

What is claimed is:

1. A method for manufacturing a thin film transistor comprising the steps of:
    adding a metal element for promoting crystallization to an amorphous semiconductor film;
    forming a crystalline semiconductor film from the amorphous semiconductor film;
    segregating the metal element in ridges formed by irradiating a first laser light to the crystalline semiconductor film so that the ridges are aligned on a surface of the crystalline semiconductor film;
    removing the ridges having the metal element from the surface of the crystalline semiconductor film, wherein holes are formed in locations where the ridges were located; and
    irradiating a second laser light directly to the crystalline semiconductor film having the holes.

2. A method according to claim 1, wherein the second laser light is irradiated to the crystalline semiconductor film with the ridges removed therefrom in an inert atmosphere.

3. A method according to claim 1, wherein the ridges are formed in order at intervals nearly equal to a wavelength of the first laser light irradiated to the crystalline semiconductor film.

4. A method according to claim 1, wherein the first laser light is pulsed laser light.

5. A method according to claim 1, wherein the second laser light is pulsed laser light.

6. A method according to claim 1, wherein the ridges are removed by a method selected from the group consisting of wet etching, dry etching, and a CMP method.

7. A method according to claim 1, wherein the ridges are removed by wet etching using an etching solution of hydrofluoric acid based etchant.

8. A method according to claim 1, wherein the ridges are removed by wet etching using an etching solution including surface-active agent.

9. A method according to claim 1, wherein the metal element for promoting the crystallization is Ni.

10. A method according to claim 1, wherein the metal element for promoting the crystallization is one element or plural elements selected from the group consisting of Fe, Co, Pd, Pt, Cu, Au, Ag, In, and Sn.

11. A method according to claim 1, wherein the metal element for promoting the crystallization is added to the amorphous semiconductor film by a method selected from the group consisting of a spin coat method, a dip method, an ion injecting method, and a sputtering method.

12. A method according to claim 1, wherein an aqueous solution including Ni acetate is applied to the amorphous semiconductor film by a spin coat method.

13. A method according to claim 1, wherein the amorphous semiconductor film is a silicon-based film.

14. A method according to claim 1, wherein the amorphous semiconductor film is an amorphous silicon semiconductor film.

15. A method according to claim 1, wherein each of the holes have a width ranging from 0.7 μm to 1 μm.

16. A method for manufacturing a semiconductor device comprising the steps of:
    adding a metal element for promoting crystallization to an amorphous semiconductor film;
    forming a crystalline semiconductor film from the amorphous semiconductor film;
    segregating the metal element in ridges formed by irradiating a first laser light to the crystalline semiconductor film so that the ridges are aligned on a surface of the crystalline semiconductor film;
    removing the ridges having the metal element from the surface of the crystalline semiconductor film, wherein holes are formed in locations where the ridges were located;
    irradiating a second laser light directly to the crystalline semiconductor film having the holes; and
    forming an electroluminescent layer above the crystalline semiconductor film.

17. A method according to claim 16, wherein the ridges are formed in order at intervals nearly equal to a wavelength of the first laser light irradiated to the crystalline semiconductor film.

18. A method according to claim 16, wherein the first laser light is pulsed laser light.

19. A method according to claim 16, wherein the second laser light is pulsed laser light.

20. A method according to claim 16, wherein the ridges are removed by a method selected from the group consisting of wet etching, dry etching, and a CMP method.

21. A method according to claim 16, wherein the ridges are removed by wet etching using an etching solution including surface-active agent.

22. A method according to claim 16, wherein the metal element for promoting The crystallization is one element or plural elements selected from the group consisting of Ni, Fe, Co, Pd, Pt, Cu, Au, Ag, In, and Sn.

23. A method according to claim 16, wherein the amorphous semiconductor film is an amorphous silicon semiconductor film.

24. A method according to claim 16, wherein each of the holes have a width ranging from 0.7 μm to 1 μm.

25. A method for manufacturing a semiconductor device comprising the steps of:
    adding a metal element for promoting crystallization to an amorphous semiconductor film;
    forming a crystalline semiconductor film from the amorphous semiconductor film;
    segregating the metal element in ridges formed by irradiating a first laser light to the crystalline semiconductor film so that the ridges are aligned on a surface of the crystalline semiconductor film;
    removing the ridges having the metal element from the surface of the crystalline semiconductor film, wherein holes are formed in locations where the ridges were located;
    irradiating a second laser light directly to the crystalline semiconductor film having the holes; and
    forming a liquid crystal layer above the crystalline semiconductor film.

26. A method according to claim 25, wherein the ridges are formed in order at intervals nearly equal to a wavelength of the first laser light irradiated to the crystalline semiconductor film.

27. A method according to claim 25, wherein the first laser light is pulsed laser light.

28. A method according to claim 25, wherein the second laser light is pulsed laser light.

29. A method according to claim 25, wherein the ridges are removed by a method selected from the group consisting of wet etching, dry etching, and a CMP method.

30. A method according to claim 25, wherein the ridges are removed by wet etching using an etching solution including surface-active agent.

31. A method according to claim 25, wherein the metal element for promoting the crystallization is one element or plural elements selected from the group consisting of Ni, Fe, Co, Pd, Pt, Cu, Au, Ag, In, and Sn.

32. A method according to claim 25, wherein the amorphous semiconductor film is an amorphous silicon semiconductor film.

33. A method according to claim 25, wherein each of the holes have a width ranging from 0.7 μm to 1 μm.

* * * * *